US008169790B2

(12) United States Patent
Kim et al.

(10) Patent No.: US 8,169,790 B2
(45) Date of Patent: May 1, 2012

(54) ELECTROMAGNETIC BANDGAP STRUCTURE AND PRINTED CIRCUIT BOARD

(75) Inventors: Han Kim, Yongin-si (KR); Je-Gwang Yoo, Yongin-si (KR); Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 702 days.

(21) Appl. No.: 12/010,561

(22) Filed: Jan. 25, 2008

(65) Prior Publication Data

US 2009/0039984 A1 Feb. 12, 2009

(30) Foreign Application Priority Data

Aug. 7, 2007 (KR) ........................ 10-2007-0079261

(51) Int. Cl.
*H05K 7/00* (2006.01)
(52) U.S. Cl. ......... 361/782; 174/262; 174/264; 174/251
(58) Field of Classification Search .................. 174/262, 174/264, 251; 333/247, 246, 116; 361/782
See application file for complete search history.

(56) References Cited

U.S. PATENT DOCUMENTS

| 5,610,569 | A | | 3/1997 | Hwang et al. | |
|---|---|---|---|---|---|
| 5,629,654 | A | * | 5/1997 | Frick | 333/116 |
| 5,696,471 | A | * | 12/1997 | Fujiwara | 333/177 |
| 5,978,231 | A | * | 11/1999 | Tohya et al. | 361/782 |
| 6,023,211 | A | * | 2/2000 | Somei | 333/246 |
| 6,483,045 | B1 | * | 11/2002 | Wang et al. | 174/264 |
| 6,696,910 | B2 | * | 2/2004 | Nuytkens et al. | 336/200 |
| 6,806,793 | B2 | * | 10/2004 | Bhatia et al. | 333/175 |
| 6,833,512 | B2 | | 12/2004 | Liu | |
| 6,977,348 | B2 | * | 12/2005 | Ho et al. | 174/255 |
| 2006/0076160 | A1 | | 4/2006 | Hsu et al. | |
| 2007/0289771 | A1 | * | 12/2007 | Osaka et al. | 174/250 |

FOREIGN PATENT DOCUMENTS

| CN | 1201363 | 12/1998 |
|---|---|---|
| JP | 06-181389 | 6/1994 |
| JP | 10-209726 | 8/1998 |
| JP | 2000-165171 | 6/2000 |
| JP | 2004-32232 | 1/2004 |
| JP | 2004-032232 | 1/2004 |
| JP | 2007-035710 | 2/2007 |

OTHER PUBLICATIONS

U.S. Appl. No. 12/222,057, filed Jul. 31, 2008, Han Kim et al., Samsung Electro-Mechanics Co., Ltd.
Japanese Office Action issued May 18, 2010 in corresponding Japanese Patent Application 2008-044270.

(Continued)

*Primary Examiner* — Tuan T Dinh
*Assistant Examiner* — Steven Sawyer (57) ABSTRACT

An electromagnetic bandgap structure and a printed circuit board having the electromagnetic bandgap that intercepts the transfer of a signal ranging a frequency band are disclosed. The electromagnetic bandgap structure includes a metal layer; a dielectric layer, stacked on the metal layer; at least two metal plates, stacked on the same planar surface of the dielectric layer; and a stitching via, connecting the adjacent metal plates. The stitching via passes through the dielectric layer, and a part of the stitching via is placed on the same planar surface of the metal layer. With the present invention, the electromagnetic bandgap can decrease the noise of a particular frequency by having a compact size and a low bandgap frequency.

21 Claims, 10 Drawing Sheets

OTHER PUBLICATIONS

English Translation of the Chinese Office Action dated Jan. 29, 2010 issued in corresponding Chinese Patent Application 200810145860.9.
Korean Office Action issued May 28, 2010 in corresponding Korean Patent Application 10-2008-0057462.
Japanese Office Action issued Nov. 9, 2010 in corresponding Japanese Patent Application 2008-199568.
Office Action dated May 10, 2011 for related U.S. Appl. No. 12/222,057.
Japanese Office Action issued Aug. 16, 2011 in corresponding Japanese Patent Application 2008-199568.
U.S. Patent Final Office Action mailed Sep. 12, 2011 in U.S. Appl. No. 12/222,057.
U.S. Office Action issued Feb. 2, 2012 in copending U.S. Appl. No. 12/222,057.

* cited by examiner

ELECTROMAGNETIC BANDGAP STRUCTURE AND PRINTED CIRCUIT BOARD

CROSS-REFERENCE TO RELATED PATENT APPLICATIONS

This application claims the benefit of Korean Patent Application No. 10-2007-0079261, filed on Aug. 07, 2007, in the Korean Intellectual Property Office, the disclosure of which is incorporated herein in its entirety by reference.

BACKGROUND OF THE INVENTION

1. Field of the Invention

The present invention relates to a printed circuit board, more specifically to an electromagnetic bandgap structure and a printed circuit board having an electromagnetic bandgap that intercept to transfer a signal ranging a predetermined frequency band.

2. Background Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

Figure 1:
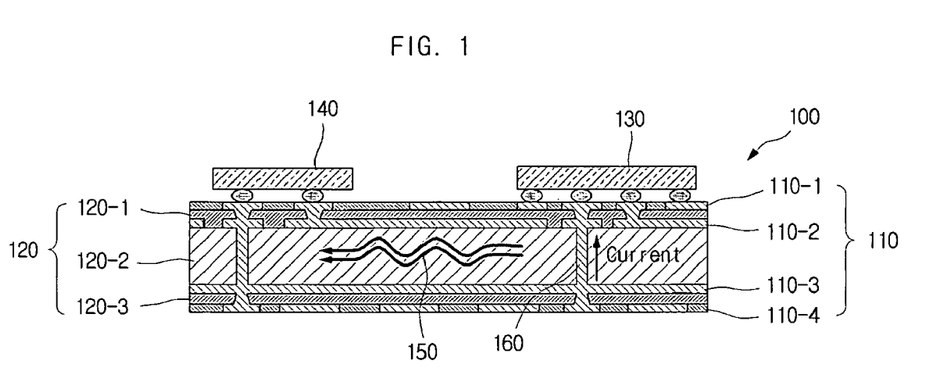
FIG. 1 is a sectional view showing a printed circuit board including an analog circuit and a digital circuit.

FIG. 1 is a sectional view showing a printed circuit board including an analog circuit and a digital circuit. Although a 4-layered printed circuit board is illustrated, various printed circuit boards such as 2 and 6-layered printed circuit boards can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140.

If it is assumed that the metal layer 110-2 is a ground layer and the metal layer 110-3 is a power layer, a current passes through a via 160 connected between the ground layer 110-2 and the power layer 110-3 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal ranging a certain frequency band, transferring the EM wave 150 including the signals ranging the certain frequency band from the digital circuit 130 may make it difficult to accurately receive the signal ranging the certain frequency band.

Solving the mixed signal problem becomes more difficult due to the increased complexity of electronic apparatuses and the higher operation frequency of the digital circuit 130.

The decoupling capacitor method, which is a typical solution for power noise, is not adequate for high frequencies. Accordingly, it is necessary to intercept or decrease the noise of the high frequencies between the RF circuit 140 and the digital circuit 130.

SUMMARY OF THE INVENTION

The present invention provides an electromagnetic bandgap structure and a printed circuit board having the electromagnetic bandgap that decrease the noise of a particular frequency by having a compact size and a low bandgap frequency.

The present invention also provides an electromagnetic bandgap structure and a printed circuit board having the electromagnetic bandgap that make it easy to design them by having a compact size and acquiring high impedance and high inductance in the case of applying a lot of active elements and passive elements to a narrow area such as a system in package (SiP).

In addition, the present invention provides an electromagnetic bandgap structure and a printed circuit board having the electromagnetic bandgap that solves a mixed signal problem in an electronic apparatus (e.g. a mobile communication terminal) including an RF circuit and a digital circuit which are placed at the same board.

Other problems that the present invention solves will become more apparent through the following description.

According to an aspect of the present invention, there is provided an electromagnetic bandgap structure intercepting to transfer a signal having a predetermined frequency band. The electromagnetic bandgap structure includes a metal layer; a dielectric layer, stacked on the metal layer; at least two metal plates, stacked on a same planar surface of the dielectric layer; and a stitching via, connecting the adjacent metal plates. Here, the stitching via passes through the dielectric layer, and a part of the stitching via is placed on a same planar surface of the metal layer.

The stitching via can include a first via, an end part of which is connected to any one of two adjacent metal plates; a second via, an end part of which is connected to the other of the two adjacent metal plates; and a connection pattern, placed on a same planar surface of the metal layer, an end part being connected to another end part of the first via, the other end part being connected to another end part of the second via.

Here, metal layer can be formed with a clearance hole, and the connection pattern is accommodated into the clearance hole A via land can be formed on at least one of an end part and the other end part of the connection pattern.

The metal plates can have a polygonal, circular or elliptic shape.

The metal plates can have the same size. Alternatively, the metal plates can be distinguished into a plurality of groups having different metal plate sizes.

According to another aspect of the present invention, there is provided a printed circuit board having an analog circuit and a digital circuit that intercept to transfer a signal ranging a frequency band from the digital circuit to the analog circuit.

The printed circuit board can include an analog circuit; and a digital circuit. Here, an electromagnetic bandgap structure is arranged between the analog circuit and the digital circuit, the electromagnetic bandgap structure being stacked with a metal layer, a dielectric layer and at least two metal plates and including a stitching via connecting the adjacent metal plates, and the stitching via passes through the dielectric layer, and a part of the stitching via is placed on a same planar surface of the metal layer Here, the metal layer can be any one of a ground layer and a power layer, and the metal plates can be connected to another layer on a same planar surface. The metal plates can be connected to another layer through the stitching via.

According to another aspect of the present invention, there is provided a printed circuit board including an electromagnetic bandgap structure between a signal layer and a ground layer that reduce the noise of a frequency band when transferring a signal through the signal layer.

In the printed circuit board, an electromagnetic bandgap structure can be arranged, the electromagnetic bandgap structure being stacked with a metal layer, a dielectric layer and at least two metal plates and including a stitching via connecting the adjacent metal plates, the stitching via can pass through the dielectric layer, and a part of the stitching via can be placed on a same planar surface of the metal layer, and the metal layer can be the ground layer, and the signal layer can be connected to the metal layer on a same planar surface.

Here, the metal plates can be connected to the signal layer through the stitching via.

The metal plates can be arranged in one row or two rows depending on a signal transfer path.

BRIEF DESCRIPTION OF THE DRAWINGS

These and other features, aspects and advantages of the present invention will become better understood with regard to the following description, appended claims and accompanying drawings where:

DESCRIPTION OF THE EMBODIMENTS

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, some embodiments of the present invention will be described in detail with reference to the accompanying drawings.

Figure 2:
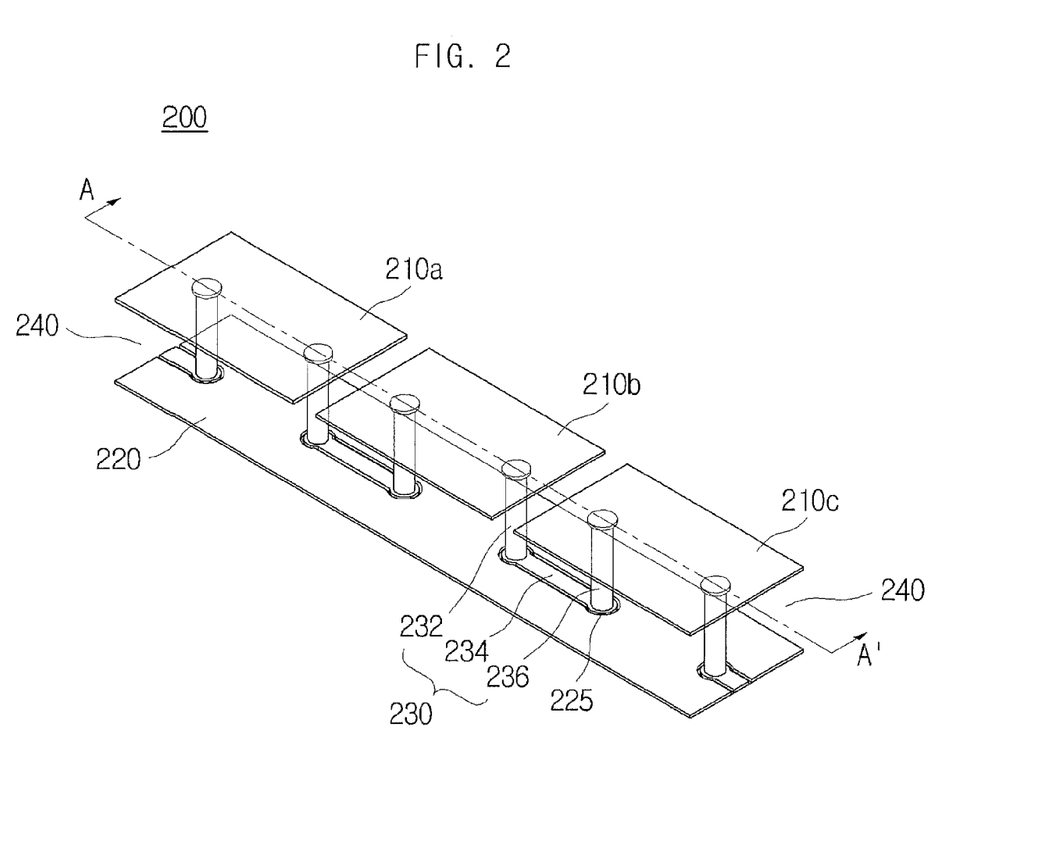
FIG. 2 is a 3-D perspective view showing an electromagnetic bandgap structure in accordance with an embodiment of the present invention.
Figure 3:
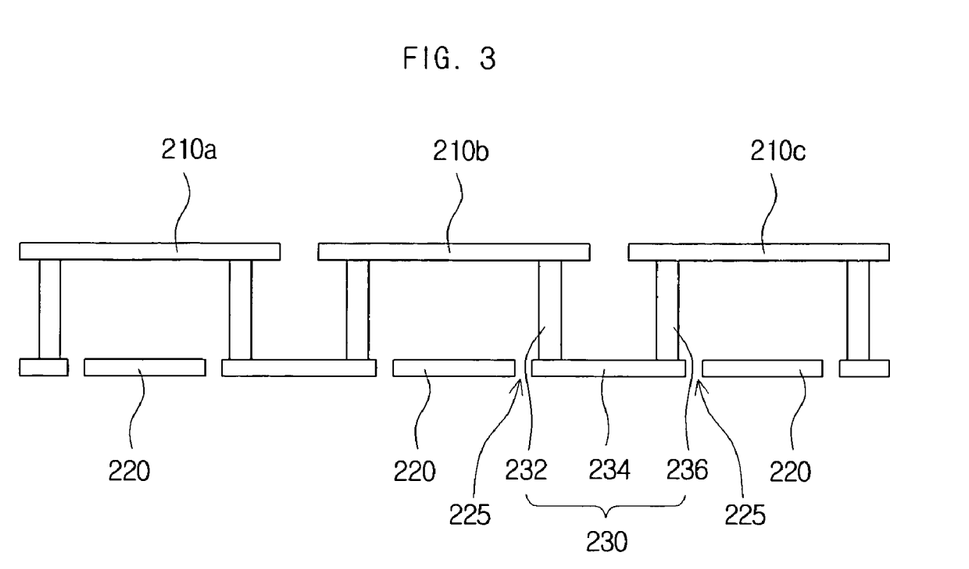
FIG. 3 is a sectional view showing the electromagnetic bandgap structure shown in FIG. 2.
Figure 4:
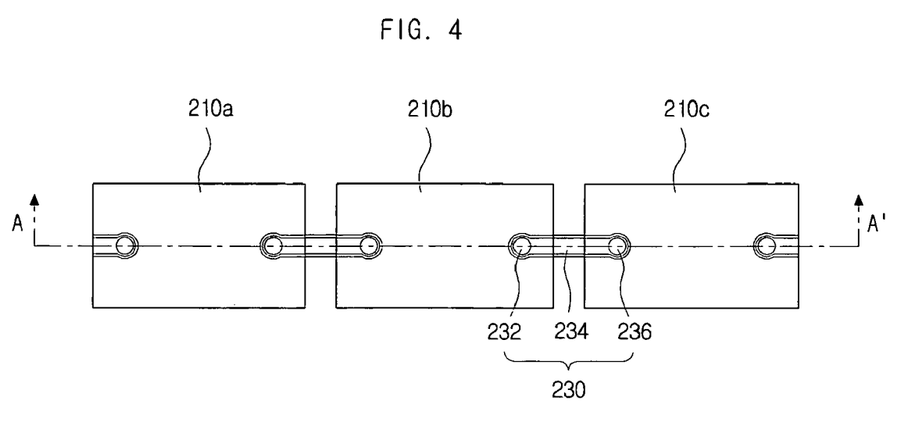
FIG. 4 is a plan view showing a configuration of the electromagnetic bandgap structure shown in FIG. 2.

FIG. 2 is a 3-D perspective view showing an electromagnetic bandgap structure in accordance with an embodiment of the present invention, and FIG. 3 is a sectional view showing the electromagnetic bandgap structure shown in FIG. 2. FIG. 4 is a plan view showing a configuration of the electromagnetic bandgap structure shown in FIG. 2. Particularly, FIG. 3 is a sectional view according to the AA' line of FIG. 2.

Referring to FIG. 2 through FIG. 4, the electromagnetic bandgap structure 200 can include metal plates 210a, 210b and 210c, a metal layer 220, a stitching via 230 and a clearance hole 225.

The electromagnetic bandgap structure 200 can typically have 2-layered planar structure. A first layer can consist of the metal layer 220, and a second layer can consist of the metal plates 210a, 210b and 210c. Of course, it is obvious that the first layer can consist of the metal plates 210a, 210b and 210c and the second layer can consist of the metal layer 220.

The metal plates 210a, 210b and 210c can be placed on the same planar surface and spaced at predetermined intervals from each other. Dielectric layers 240 can be stacked in between the metal layer 220 and the metal plates 210a, 210b and 210c.

The metal layer 220 and the metal plates 210a, 210b and 210c can be configured to include a material (e.g. copper) capable of receiving a power and of transferring a signal.

The stitching via 230 can connect two adjacent metal plates (e.g. the metal plates 210b and 210c in FIG. 2). In particular, the stitching via 230 may not connect the two adjacent metal plates 210b and 210c on the same planar surface. The stitching via 230 can connect the two adjacent metal plates 210b and 210c through another layer (e.g. the metal layer 220 in this case).

The stitching via 230 can be configured to include a first via 232, a connection pattern 234 and a second via 236. The first via 232 can have a first end part, which is connected to the first metal plate 210b, and a second end part, which is connected to an end part of the connection pattern 234. The second via 236 can have a first end part, which is connected to the second metal plate 210c, and a second end part, which is connected to another end part of the connection pattern 234. Each of the opposite end parts of the connection pattern 234 can be formed with a via land for connecting the first via 232 and/or the second via 236.

The two adjacent metal plates 210b and 210c can be connected in series through the stitching via 230. Particularly, the two adjacent plates 210b and 210c can be electrically connected in series in the order of the first metal plate 210b→the stitching via 230 (the first via 232→the connection pattern 234→the second via 236)→the second metal plate 210b.

The first metal plate 210b can be connected to the other metal plate 210a through the stitching via 230. The second metal plate 210c can also be connected to another metal plate (not shown) through the stitching via 230. Accordingly, all metal plates, placed at the second layer, can be connected in series through the stitching via 230.

The metal layer 220 can be formed with the clearance hole 225 accommodating the connection pattern 234. The clearance hole 225 can accommodate the via land for easy connection with the first via 232 and/or the second via 236 as well as the connection pattern 234. The clearance hole 225 may allow the stitching via 230 and the metal layer 220 to be electrically disconnected to each other.

Connecting the metal plates 210a, 210b and 210c through the stitching via 230 may be unnecessary to form the pattern for connecting the metal plates 210a, 210b and 210c in the second store. Accordingly, each of the metal plates 210a, 210b and 210c can have a smaller size and thus each distance between the metal plates 210a, 210b and 210c can be narrower, to thereby increase the capacitance of the gaps between the metal plates 210a, 210b and 210c.

In the present invention, the metal plates 210a, 210b and 210c can be placed on the same planar surface as a different metal layer from the metal layer 220. Accordingly, the metal plate 210a, placed in the most left side, can be connected to a metal layer that is different from the metal layer 220 through the stitching via 230.

In case that the metal layer 220 is the power layer, the different metal layer can be the ground layer. In case that the metal layer 220 is the ground layer, the different metal layer can be the power layer.

Alternatively, the metal layer 220 can be the ground layer and the different metal layer can be the signal layer, to transfer a signal in a predetermined direction. The noise of a certain frequency, which is included in the signal transferred by arranging the foregoing metal plates 210a, 210b and 210c and the stitching via 230 in a part of a signal transfer path of the signal layer, can be decreased.

Referring to FIG. 2 through FIG. 4, the metal plates 210a, 210b and 210c can be arranged in one row, and two stitching vias can be connected to each metal plate. However, in accordance with another embodiment of the present invention, a metal plate can be arranged in an m×n sized matrix, m and n being natural numbers, and adjacent metal plates can be connected by using the stitching via. In this case, each metal plate can function as a path connecting adjacent metal plates and be connected to at least two stitching vias. Hereinafter, various embodiments according to the shapes and the configurations of the metal plates will be described with reference to the related drawings.

Figure 5:
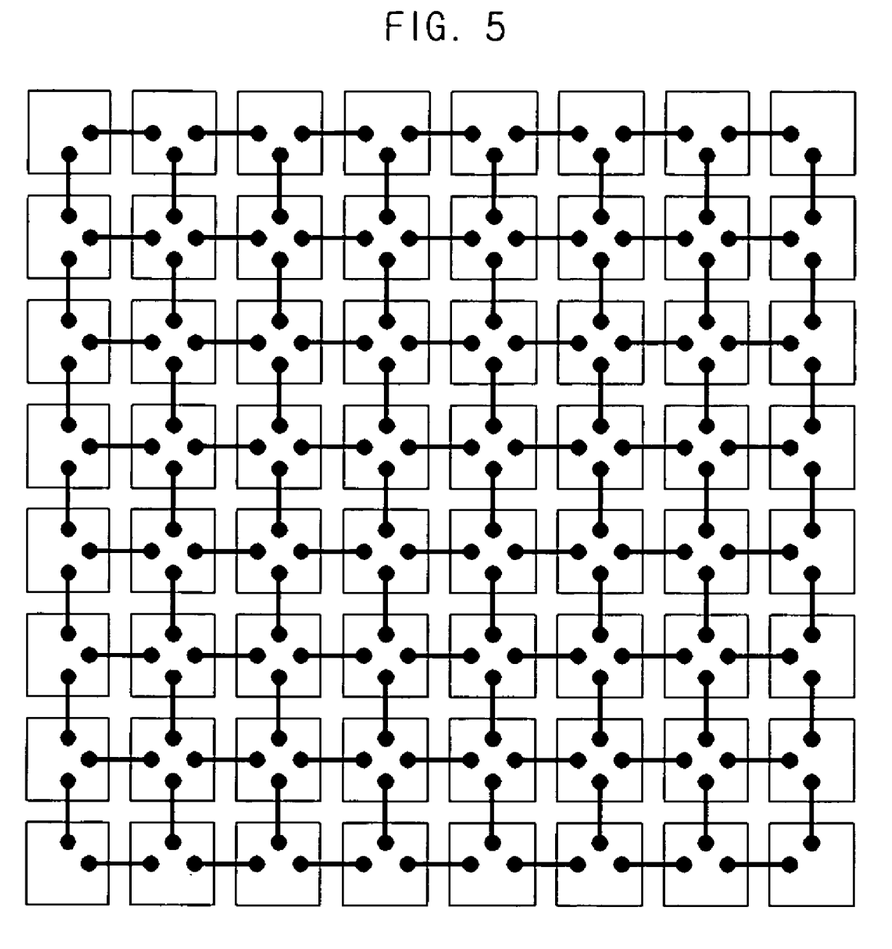
FIG. 5 is a plan view showing a configuration of an electromagnetic bandgap structure including a square-shaped metal plate in accordance with another embodiment of the present invention.
Figure 6:
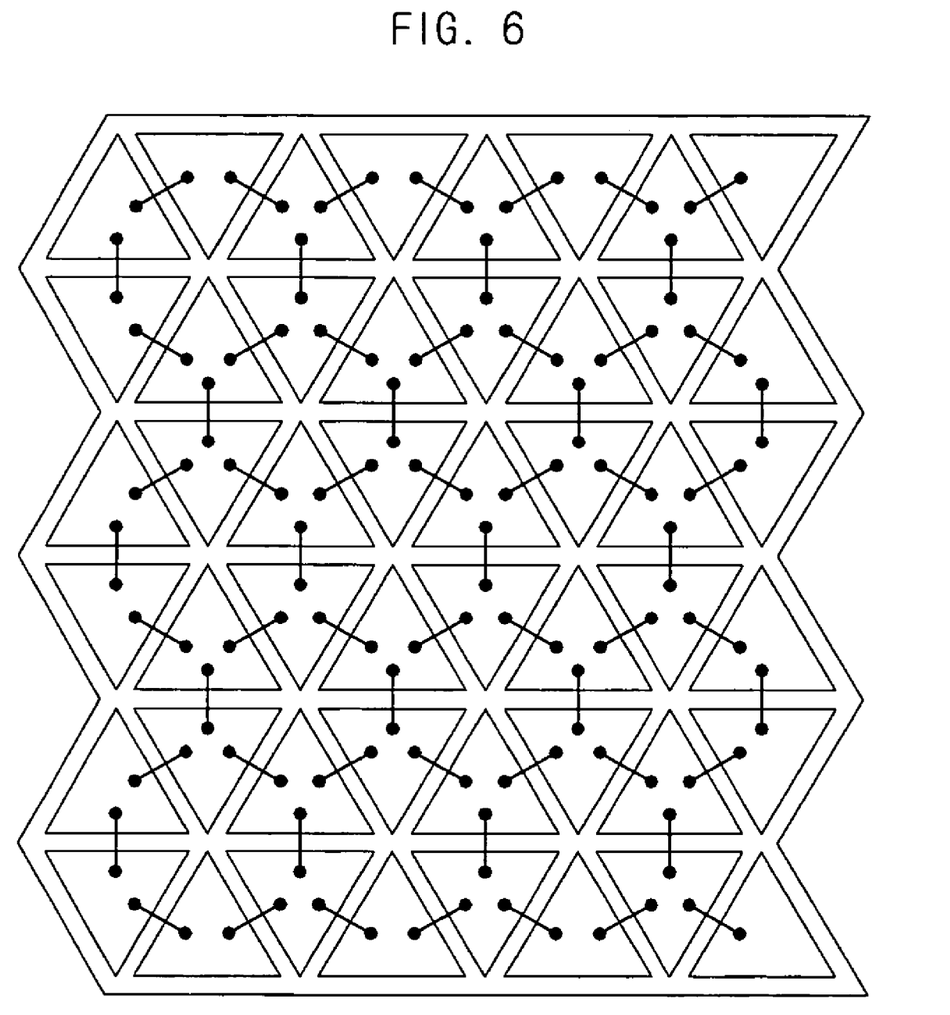
FIG. 6 is a plan view showing a configuration of an electromagnetic bandgap structure including a triangle-shaped metal plate in accordance with another embodiment of the present invention.

FIG. 5 is a plan view showing a configuration of an electromagnetic bandgap structure including a square-shaped metal plate in accordance with another embodiment of the present invention. FIG. 6 is a plan view showing a configuration of an electromagnetic bandgap structure including a triangle-shaped metal plate in accordance with another embodiment of the present invention, and FIG. 7 is a plan view showing a band-shaped configuration of an electromagnetic bandgap structure in accordance with another embodiment of the present invention.

The metal plate can have polygonal shapes such as a triangle (refer to FIG. 6) and a hexagon or various shapes such as a circle and an ellipse as well as a square shape (refer to FIG. 5).

Figure 7:
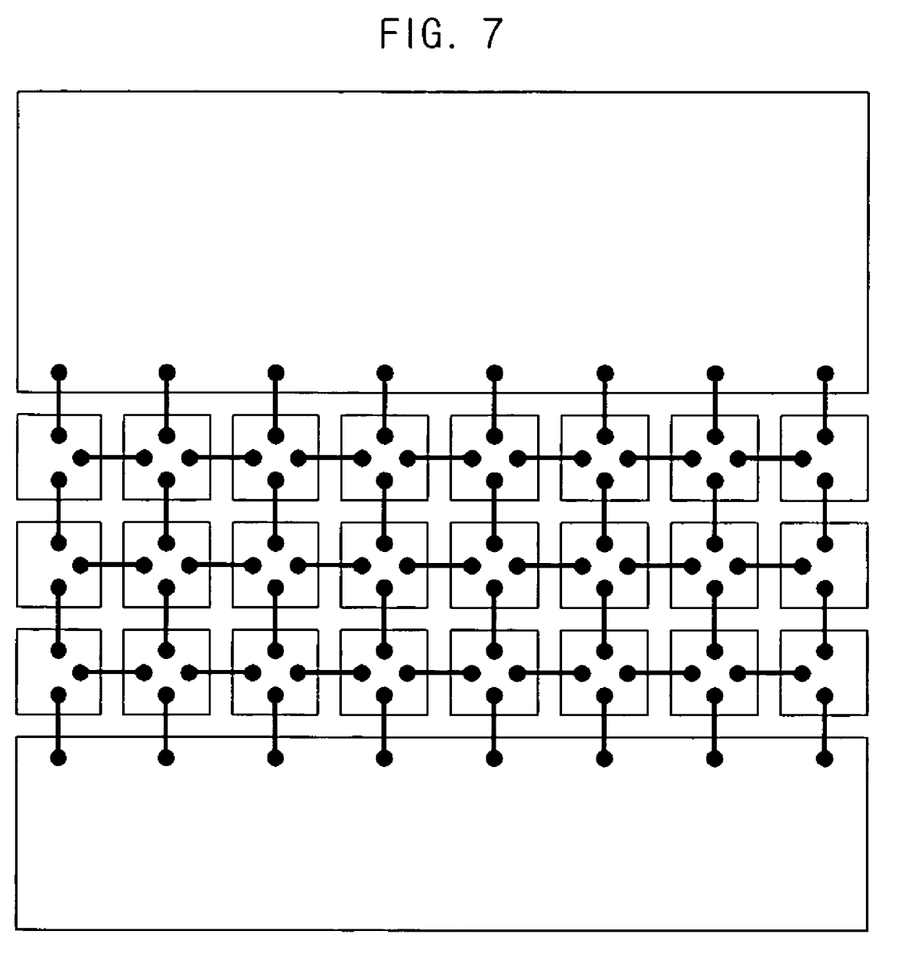
FIG. 7 is a plan view showing a band-shaped configuration of an electromagnetic bandgap structure in accordance with another embodiment of the present invention.

Also, the metal plates, which are connected by the stitching via, can be arranged on an entire board (refer to FIG. 5 and FIG. 6) or a part of the board (refer to FIG. 7).

The metal plate can be connected to two adjacent different metal plates by being connected to two stitching vias, as described in FIG. 2, or four adjacent different metal plates by being connected to four stitching vias, as described in FIG. 5. Alternatively, as described in FIG. 6, the metal plate can be connected to three adjacent different metal plates by being connected to three stitching vias.

In this case, the metal plates, which have been arranged in a path between a signal source and a signal-transferred position, are required not to be disconnected by the stitching via. In other words, the metal plates are arranged in two rows, and all adjacent metal plates of each metal plate can be connected by the stitching via. Alternatively, each metal plate can be connected in a zigzag form.

Figure 8:
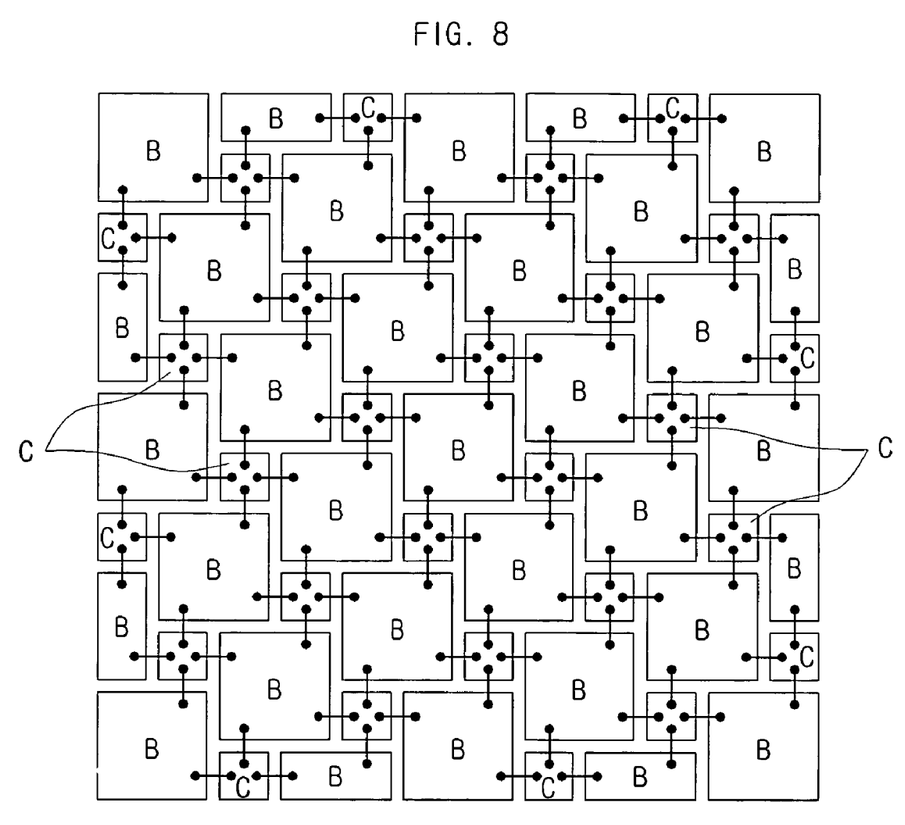
FIG. 8 and FIG. 9 are plan views showing a configuration according to the size of a metal plate in accordance with another embodiment of the present invention.
Figure 9:
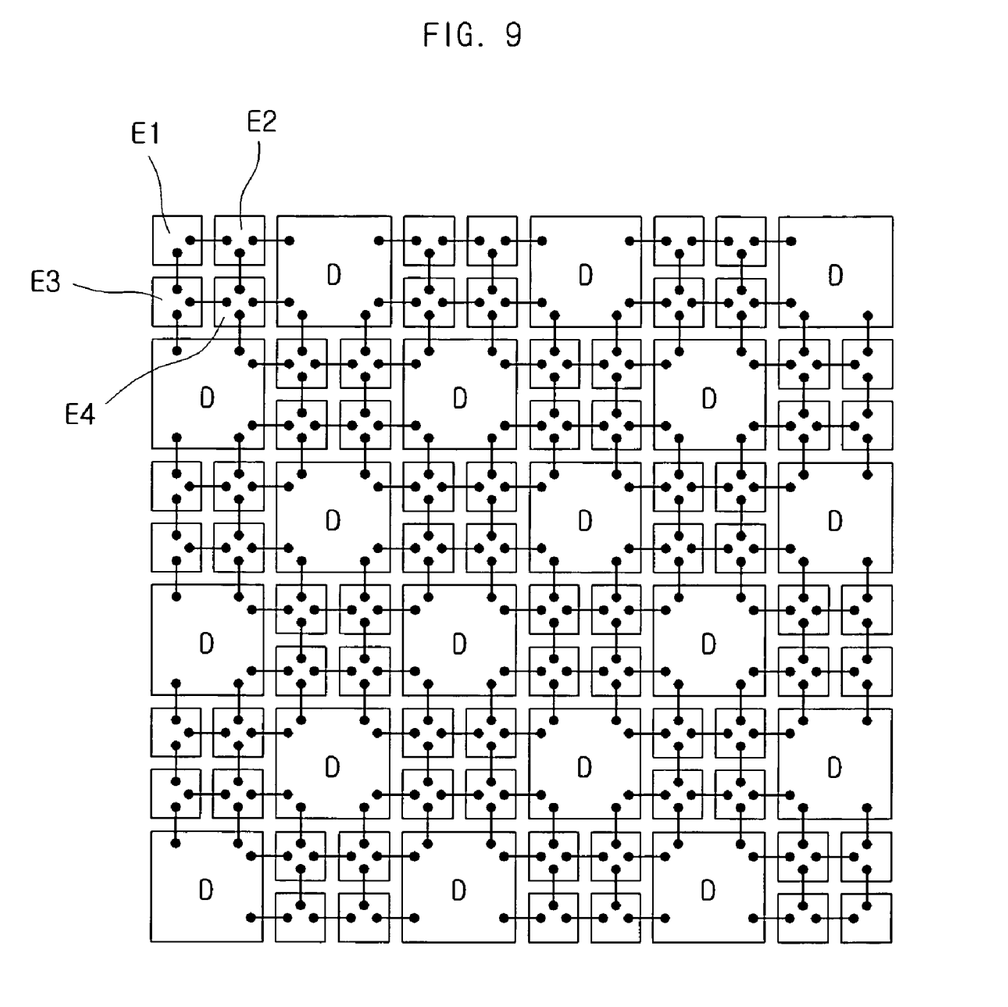

FIG. 8 and FIG. 9 are plan views showing a configuration according to the size of a metal plate in accordance with another embodiment of the present invention.

All metal plates, connected by the stitching via, can have the same size as described above or different size as illustrated in FIGS. 8 and 9. In other words, the metal plates can be distinguished into a plurality of groups having a different size.

Referring to FIG. 8, big metal plates B having a relatively bigger size and small metal plates C having a relatively smaller size can be alternately arranged, and each metal plate can be connected to adjacent metal plates through the stitching vias. In other words, the large metal plates B and the small metal plates C can be connected to adjacent metal plates by four stitching vias.

Referring to FIG. 9, big metal plates D having a relatively bigger size and small metal plates E1, E2, E3 and E4 having a relatively smaller size can be arranged. The small metal plates E1, E2, E3 and E4 can be grouped in a 2×2 form. Each group consisting of the 4 small metal plates E1, E2, E3 and E4 can have the similar area size to the large metal plate D. The small metal plates E1, E2, E3 and E4, respectively, can be connected to adjacent metal plates through 4 stitching vias. Also, since there are 8 small metal plates around the large metal plate D, the large metal plate D can be connected to adjacent small metal plates through 8 stitching vias.

As described above, the arrangements combined with the differently sized metal plates can intercept the transfer of a signal corresponding to a certain frequency or decrease the corresponding noise.

Figure 10:
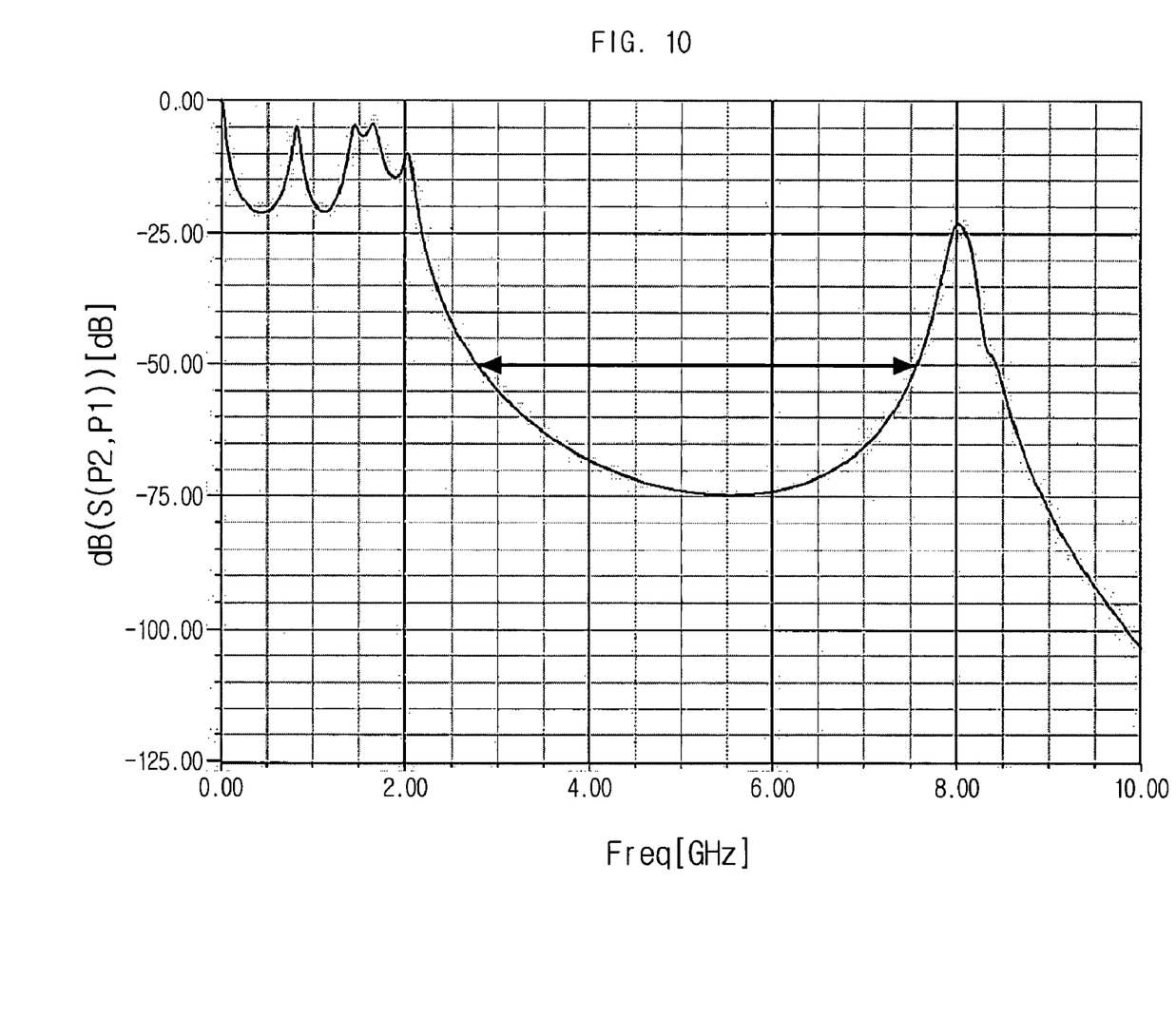
FIG. 10 is a graph showing the frequency property of an electromagnetic bandgap structure including a stitching via in accordance with an embodiment of the present invention.

FIG. 10 is a graph showing the frequency property of an electromagnetic bandgap structure including a stitching via in accordance with an embodiment of the present invention. FIG. 10 illustrates the result in which a simulation model is formed for the electromagnetic bandgap structure including the stitching via and then is analyzed by using a scattering parameter.

On a −50 db basis, it can be recognized that a stop band, which intercepts the signal transferred through the electromagnetic bandgap structure, is formed in an area ranging the frequency band between about 2.8 and 7.5 GHz.

Of course, the frequency band of the stop band can be designed so as to have a desired frequency band by suitably adjusting various properties such as the size of the electromagnetic band gap structure, the dielectric constant and configuration of the dielectric layer and the shape, size and number of the metal plate.

A printed circuit board in accordance with an embodiment of the present invention can be a system in package (SiP).

The printed circuit board can include a signal layer and a ground layer. A signal, transferred along the signal along the signal layer, may generate noise due to a high operation frequency. In this case, the forgoing electromagnetic bandgap structure can be applied to decrease the noise having a certain frequency.

The ground layer can be a metal layer, and the metal layers can be arranged to be spaced at certain intervals from each other on the same planar surface as the signal layer. Each metal plate can be connected through the stitching via. A first via and a second via of the stitching via can be connected to a connection pattern formed on the ground layer. The connection pattern can be accommodated into a clearance hole to be in no contact with the connection pattern.

The metal plates can be arranged in one row or two rows on the signal layer depending on a signal transfer path. Each metal plate can be connected by stitching vias to transfer a signal from a signal source to a signal transfer position without disconnection.

In accordance with another embodiment of the present invention, the printed circuit board can include an analog circuit and a digital circuit. The analog circuit can be a radio frequency (RF) circuit such as an antenna receiving a wireless signal (e.g. an RF signal) from the outside.

In the printed circuit board, the forgoing electromagnetic bandgap structure can be arranged between the analog circuit and the digital circuit.

Particularly, the electromagnetic bandgap structure can be arranged in order that an electromagnetic wave, to be transferred from the digital circuit to the analog circuit, necessarily passes through the electromagnetic bandgap structure. In other words, the electromagnetic bandgap structure can be arranged in a form of a closed curve in a surrounding area of the analog circuit or can be arranged in an entire part or a part inside the printed circuit board from the digital circuit to the analog circuit.

The electromagnetic bandgap structure can be arranged between the power layer and the ground layer among the layers, included in the printed circuit board.

Any one of the ground layer and the power layer can be the metal layer. The metal plates can be arranged to be spaced at certain intervals from each other on the same planar surface as another layer. Each metal plate can be connected through the stitching via. A first via and a second via of the stitching via can be connected to a connection pattern formed in the metal layer. The connection pattern can be accommodated into a clearance hole to be in no contact with the connection pattern.

As the aforementioned electromagnetic bandgap structure is arranged inside the printed circuit board having the digital circuit and the analog circuit, realized therein together, the printed circuit board can prevent an electromagnetic wave having a certain frequency band, among the electromagnetic waves, to be transferred from the digital circuit to the analog circuit, from being transferred.

In other words, despite the size of a small structure, it is possible to solve the foresaid mixed signal problem by restraining an electromagnetic wave ranging a certain frequency band, corresponding to noise in the analog circuit, from being transferred.

Although some embodiments of the present invention have been described, anyone of ordinary skill in the art to which the invention pertains should be able to understand that a very large number of permutations are possible without departing the spirit and scope of the present invention and its equivalents, which shall only be defined by the claims appended below.

What is claimed is:

1. An electromagnetic bandgap structure comprising: a metal layer; a dielectric layer, stacked on the metal layer; a plurality of metal plates arranged two-dimensionally on a same planar surface of the dielectric layer; and a plurality of stitching vias configured to electrically connect the adjacent metal plates with one another, wherein the stitching via comprise a first via, an end part of which is connected to any one of two adjacent metal plates; a second via, an end part of which is connected to the other of the two adjacent metal plates; and a connection line pattern, placed on a same planar surface of the metal layer, an end part thereof being connected to the other end part of the first via, the other end part thereof being connected to the other end part of the second via, wherein metal plates that are not placed in outermost areas of the two-dimensionally arranged metal plates are respectively connected with at least three of the stitching vias.

2. The structure of claim 1, wherein the metal layer is formed with a clearance hole, and the conductive line pattern is accommodated into the clearance hole.

3. The structure of claim 1, further comprising a via land formed on at least one of the first and second end parts of the conductive line pattern.

4. The structure of claim 1, wherein the metal plates have a polygonal, circular or elliptic shape.

5. The structure of claim 1, wherein the metal plates have the same size.

6. The structure of claim 1, wherein the metal plates are distinguished into a plurality of groups having different metal plate sizes.

7. A printed circuit board comprising:
an analog circuit; and
a digital circuit,
wherein an electromagnetic bandgap structure is arranged between the analog circuit and the digital circuit,
wherein the electromagnetic bandgap structure comprises
a metal layer;
a dielectric layer, stacked on the metal layer;
a plurality of metal plates arranged two-dimensionally on a same planar surface of the dielectric layer; and
a plurality of stitching vias configured to electrically connect the metal plates with one another,
wherein the stitching via comprises
a first via, an end part of which is connected to any one of two adjacent metal plates;
a second via, an end part of which is connected to the other of the two adjacent metal plates; and
a connection pattern, placed on a same planar surface of the metal layer, an end part thereof being connected to the other end part of the first via, the other end part thereof being connected to the other end part of the second via,
wherein metal plates that are not placed in outermost areas of the two-dimensionally arranged metal plates are respectively connected with at least three of the stitching vias.

8. The printed circuit board of claim 7, wherein the metal layer is any one of a ground layer and a power layer, and the metal plates are connected to the other one of the ground layer and the power layer on a same planar surface.

9. The printed circuit board of claim 7, wherein the metal plates are connected to the other one of the ground layer and the power layer through the stitching via.

10. The printed circuit board of claim 7, wherein the metal layer is formed with a clearance hole, and the conductive line pattern is accommodated into the clearance hole.

11. The printed circuit board of claim 7, further comprising a via land formed on any one of the first and second end parts of the conductive line pattern.

12. The board of claim 7, wherein the metal plates have a polygonal, circular or elliptic shape.

13. The board of claim 7, wherein the metal plates have the same size.

14. A printed circuit board comprising:
   a signal layer; and
   a ground layer,
   wherein an electromagnetic bandgap structure is arranged, the electromagnetic bandgap structure comprises
      a metal layer;
      a dielectric layer, stacked on the metal layer;
      a plurality of metal plates arranged two-dimensionally on a same planar surface of the dielectric layer; and
      a plurality of stitching vias configured to electrically connect the metal plates with one another,
   wherein the stitching via comprises
      a first via, an end part of which is connected to any one of two adjacent metal plates;
      a second via, an end part of which is connected to the other of the two adjacent metal plates; and
      a connection pattern, placed on a same planar surface of the metal layer, an end part thereof being connected to the other end part of the first via, the other end part thereof being connected to the other end part of the second via,
   wherein metal plates that are not placed in outermost areas of the two-dimensionally arranged metal plates are respectively connected with at least 3 of the stitching vias.

15. The printed circuit board of claim 14, wherein the metal plates are connected to the signal layer through the stitching via.

16. The printed circuit board of claim 14, wherein the metal layer is formed with a clearance hole, and the conductive line pattern is accommodated into the clearance hole.

17. The printed circuit board of claim 14, wherein a via land is formed on any one of the first and second end parts of the conductive line pattern.

18. The printed circuit board of claim 14, wherein the metal plates have a polygonal, circular or elliptic shape.

19. The printed circuit board of claim 14, wherein the metal plates have the same size.

20. The printed circuit board of claim 14, wherein the metal plates are distinguished into a plurality of groups having different metal plate sizes.

21. The printed circuit board of claim 15, wherein the metal plates are distinguished into a plurality of groups having different metal plate sizes.

* * * * *

UNITED STATES PATENT AND TRADEMARK OFFICE
CERTIFICATE OF CORRECTION

PATENT NO. : 8,169,790 B2
APPLICATION NO. : 12/010561
DATED : May 1, 2012
INVENTOR(S) : Han Kim et al.

It is certified that error appears in the above-identified patent and that said Letters Patent is hereby corrected as shown below:

In the Claims

Column 7, Line 66 - Column 8, Line 16, please delete Claim 1 in its entirety and replace with the following     1.    An electromagnetic bandgap structure comprising:

a metal layer;

a dielectric layer, stacked on the metal layer;

a plurality of metal plates arranged two-dimensionally on a same planar surface of the dielectric layer; and a plurality of stitching vias configured to electrically connect the metal plates with one another,     wherein the stitching via comprises         a first via, an end part of which is connected to one of the two adjacent metal plates,         a second via, a first end part of which is connected to the other of the two adjacent metal plates, and         a connection line pattern, placed on a same planar surface of the metal layer, an end part thereof being connected to the other end part of the first via, the other end part thereof being connected to the other end part of the second via,     wherein metal plates that are not placed in outermost areas of the two-dimensionally arranged metal plates are respectively connected with at least three of the stitching vias.

Signed and Sealed this
First Day of April, 2014

Michelle K. Lee
*Deputy Director of the United States Patent and Trademark Office*

CERTIFICATE OF CORRECTION (continued)
U.S. Pat. No. 8,169,790 B2

Column 10, Lines 21-23, please delete Claim 21 in its entirety and replace with the following 21. The board of claim 7, wherein the metal plates are distinguished into a plurality of groups having different metal plate sizes.